US012615919B2

(12) United States Patent
  Bai

(10) Patent No.: US 12,615,919 B2
(45) Date of Patent: Apr. 28, 2026

(54) DISPLAY WITH TWO STACKED PIXEL DEFINITION LAYERS

(71) Applicant: SHENZHEN CHINA STAR OPTOELECTRONICS SEMICONDUCTOR DISPLAY TECHNOLOGY CO., LTD., Shenzhen (CN)

(72) Inventor: Yamei Bai, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 475 days.

(21) Appl. No.: 18/175,556

(22) Filed: Feb. 28, 2023

(65) Prior Publication Data

US 2024/0224600 A1      Jul. 4, 2024

(30) Foreign Application Priority Data

Dec. 31, 2022    (CN) .......................... 202211737619.1

(51) Int. Cl.
  *H10K 59/122*        (2023.01)
  *H10K 59/12*         (2023.01)
(52) U.S. Cl.
  CPC ....... *H10K 59/122* (2023.02); *H10K 59/1201* (2023.02)
(58) Field of Classification Search
  CPC ................................................... H10K 59/122
  See application file for complete search history.

(56) References Cited

U.S. PATENT DOCUMENTS

| | | | | |
|---|---|---|---|---|
| 2021/0359042 A1* | 11/2021 | Hou | ...................... | H10K 59/121 |
| 2022/0005892 A1* | 1/2022 | Liu | ...................... | H10K 59/122 |
| 2023/0041252 A1* | 2/2023 | Chen | ...................... | H10K 50/844 |

FOREIGN PATENT DOCUMENTS

| | | | | | |
|---|---|---|---|---|---|
| CN | 109216577 A | * | 1/2019 | ............. | H10K 71/00 |
| CN | 118102781 A | * | 5/2024 | ......... | H10K 59/8723 |
| JP | 2016222840 A | * | 12/2016 | | |
| JP | 2018045873 A | * | 3/2018 | | |
| KR | 20050049688 A | * | 5/2005 | .......... | H10K 50/865 |
| KR | 20180003965 A | * | 1/2018 | ....... | H10K 59/80522 |
| KR | 20190070424 A | * | 6/2019 | ......... | H01L 27/3211 |

* cited by examiner

*Primary Examiner* — Peter Bradford
(74) *Attorney, Agent, or Firm* — PV IP PC; Peter Stecher; Wei Te Chung

(57)                ABSTRACT

The present invention provides a display panel and a manufacturing method thereof. The display panel includes an array substrate, a pixel definition layer, and an organic light emitting device. The pixel definition layer includes a first definition layer and a second definition layer laminated together. The first definition layer includes a first aperture. The second definition layer includes a second aperture corresponding to the first aperture. The organic light emitting device is disposed in the first aperture. area of the top surface of the first definition layer is different from an area of the bottom surface of the second definition layer such that at least a part of a side surface of the first definition layer and a side surface of the second definition layer are in different planes.

16 Claims, 6 Drawing Sheets

DISPLAY WITH TWO STACKED PIXEL DEFINITION LAYERS

FIELD OF INVENTION

The present invention relates to a field of display apparatuses, especially to a display panel and a manufacturing method thereof.

BACKGROUND OF INVENTION

An organic light emitting diode (organic electroluminescence diode, OLED) display panel has become the preferred substrate type for large, medium, and small size products in the market due to its advantages of thinness, self-illumination, high contrast, wide color gamut, and flexibility.

An OLED is formed by organic film layer. Electrons and holes are injected in to a cathode and an anode respectively and is compounded in a light emitting layer to form exciters to irradiate light. There are two technologies for manufacturing OLED display panels: evaporation and inkjet printing (IJP). Evaporation is in vacuum, by a method such as current heating, electron bream bombardment heating, and laser heating method, evaporating material into atoms or molecules, and these atoms or molecules immediately move linearly in a greater degree of freedom to collide a substrate surface and condense into a thin film, which can be deemed as a phenomenon of water vapor evaporation. Further, a fine metal mask (FMM) is used for patterning it. Printing means jetting OLED material of an ink state through an inkjet nozzle between pixel definition layers. Compared to evaporation, advantage of the inkjet printing is as follow: first, inkjet printing process is simpler; second, material use rate is high and the cost is lower; third, in an application of a large size OLED display panel, evaporation, due to factors such as gravity and thermal expansion, results in deformation of the mask to cause an issue of mixed colors and therefore is limited, and the inkjet printing is easier performed in the large size OLED display panel. As the above many advantages, the inkjet printing becomes a preferred technology of the large size OLED display panel.

However, ink material of the IJP OLED printed onto the substrate is affected by a Marangoni effect, and ink surface tensions in an edge region and a central region are different to form a Marangoni convection: When the surface tension in the edge region is higher than that in the central region, convection makes the thin film concave. When the surface tension in the central region is higher than that in the edge region, convection makes the thin film convex. Therefore, a flatness of the film layer is seriously affected to further influence product performance.

SUMMARY OF INVENTION

An objective of the present invention is to provide a display panel and a manufacturing method thereof to solve a technical issue that in a conventional technology a Marangoni effect results in uneven film formation of organic material film layer of an OLED of inkjet printing.

To achieve the above objective, the present invention provides a display panel, the display panel comprising an array substrate; an organic light emitting device; and a pixel definition layer, comprising: a first definition layer disposed on a surface of the array substrate; and a second definition layer disposed on a surface of the first definition layer away from the array substrate; wherein a top surface of the first definition layer contacts a bottom surface of the second definition layer, and an area of the top surface of the first definition layer is different from an area of the bottom surface of the second definition layer such that at least a part of a side surface of the first definition layer and a side surface of the second definition layer are in different planes; wherein the first definition layer comprises a first aperture, the side surface of the first definition layer is connected to a part of a top surface of the array substrate and surrounds the first aperture; wherein the second definition layer comprises a second aperture corresponding to the first aperture, a top end of the first aperture is connected to a bottom end of the second aperture; wherein the organic light emitting device is disposed in the first aperture.

Furthermore, the area of the top surface of the first definition layer is greater than the area of the bottom surface of the second definition layer, a side surface of the second definition layer intersects the top surface of the first definition layer, a diameter of the top end of the first aperture is less than a diameter of the bottom end of the second aperture, a part of the top surface of the first definition layer is exposed at the bottom end of the second aperture; and a thickness of the first definition layer is thinner than or equal to a thickness of the organic light emitting device.

Furthermore, the area of the top surface of the first definition layer is less than the area of the bottom surface of the second definition layer; the side surface of the first definition layer intersects the bottom surface of the second definition layer; a diameter of the top end of the first aperture is greater than a diameter of the bottom end of the second aperture, a part of the bottom surface of the second definition layer is exposed at the top end of the first aperture; and a thickness of the organic light emitting device is thinner than or equal to a thickness of the first definition layer.

Furthermore, the first definition layer comprises: a main body portion located on a side of the first definition layer away from the second definition layer, wherein a side surface of the main body portion and a side surface of the second definition layer are in a same plane; a reduction portion located between the main body portion and the second definition layer; wherein a top surface of the reduction portion contacts the bottom surface of the second definition layer, and an area of the top surface of the reduction portion is less than the area of the bottom surface of the second definition layer; a thickness of the main body portion is thinner than the thickness of the organic light emitting device.

Furthermore, a thickness of the reduction portion is less than a thickness of the main body portion.

Furthermore, a central axis of the first aperture coincides with a central axis of the second aperture.

Furthermore, a chasm is formed between the side surface of the main body portion and the side surface of the second definition layer and is configured to interrupt coherence between the sidewall of the first aperture and the sidewall of the second aperture.

Furthermore, the pixel definition layer comprises a position limiting aperture comprising the first aperture and the second aperture; and the chasm forms a notch in a sidewall of the position limiting aperture.

Furthermore, the notch damages flatness of the sidewall of the position limiting aperture and makes a part of the bottom surface of the second definition layer exposed in the notch and shielding a part of the top end of the first aperture.

Furthermore, the notch is annular.

Furthermore, the first aperture, the second aperture, and the notch are tapered.

The present invention also provides a display panel manufacturing method, comprising steps as follows: forming a first definition layer on an array substrate; forming a first aperture in the first definition layer; forming a second definition layer on the first definition layer; forming a second aperture corresponding to the first aperture in the second definition layer; forming an organic light emitting device in the first aperture; wherein an area of the top surface of the first definition layer is different from an area of a bottom surface of the second definition layer such that at least a part of a side surface of the first definition layer and a side surface of the second definition layer are in different planes.

Furthermore, the step of forming the first aperture in the first definition layer comprises: after forming the first definition layer, patterning the first definition layer by a photolithography process and forming the first aperture penetrating the first definition layer; the step of forming the second aperture corresponding to the first aperture in the second definition layer comprises: after forming the second definition layer, patterning the second definition layer by a photolithography process and forming the second aperture communicating with the first aperture.

Furthermore, the area of the top surface of the first definition layer is greater than the area of the bottom surface of the second definition layer, and an amount of exposure of lithographing the first definition layer is less than an amount of exposure of lithographing the second definition layer.

Furthermore, the area of the top surface of the first definition layer is less than the area of the bottom surface of the second definition layer, and an amount of exposure of lithographing the second definition layer is less than an amount of exposure of lithographing the first definition layer.

Advantages of the present invention are as follows: a display panel and a display panel manufacturing method of the present invention, blocks a surface fluidity of organic light emitting device before curing by changing a structure of an aperture to prevent the surface of the organic light emitting device from being convex or concave due to the Marangoni effect, which improves uniformity of film formation of the organic light emitting device surface to further increase a surface flatness of the organic light emitting device and improves performance of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
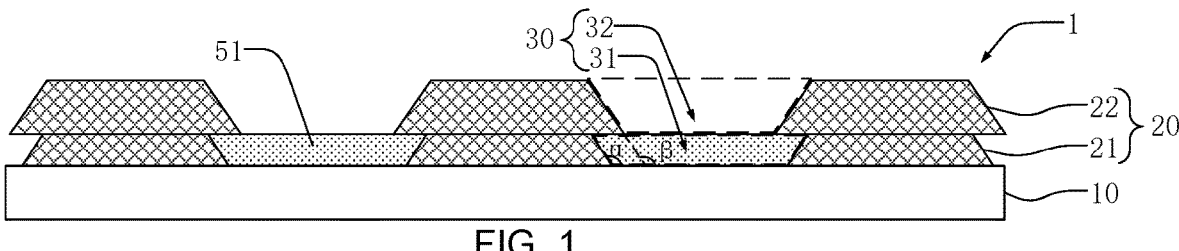
FIG. 1 is a schematic layer structural view of a display panel of the embodiment 1 of the present invention.

The preferred embodiments of the present invention are described below with reference to the accompanying drawings, which are used to exemplify the embodiments of the present invention to a person of ordinary skill in the art to make the technical contents of the present invention clearer and easy to understand. However, the present invention may be embodied in many different forms of embodiments, and the scope of the invention is not limited to the embodiments mentioned herein.

In the drawings, elements with the same structures are indicated with the same numerals, and elements with similar structures or functions are indicated with similar numerals. Furthermore, for convenience of understanding and description, the dimension and thickness of each assembly in the drawings are depicted at arbitrarily, and the present invention has no limit to the dimension and thickness of each assembly. To make the figures clearer, thicknesses of parts in some places of the drawings are exaggerated.

Furthermore, each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of indicating or implying that the specified device or element must have a specification orientation or be structured and operated in a specific orientation. Therefore, it cannot be understood as a limit to the present invention. Moreover, terminologies "first", "second", "third", etc. are only for purposes of description and cannot be understood as indication or implication of comparative importance.

When some parts are described as "on" another part, the part can be placed directly on the other part. There can also be an intermediate part, the part is placed on the intermediate part, and the intermediate part is placed on another part. When a part is described as being "mounted to" or "connected to" another part, both can be understood as being "mounted" or "connected" directly, or a part is indirectly "mounted" through an intermediate part mounted to", or "connected to" another component.

Embodiment 1

The embodiment of the present invention provides a display device. The display device is an OLED display device and comprises a display panel 1. The display panel 1 is configured to display screen images. The display device can be any display device with displaying functions, for example, a cell phone, notebook, tablet, etc.

The display panel 1 comprises an array substrate 10, a pixel definition layer 20, and an organic light emitting device layer.

The organic light emitting device layer comprises a plurality of organic light emitting devices 51. The organic light emitting devices 51 are evenly distributed on a surface of the array substrate 10 and are electrically connected to the array substrate 10. Several thin film transistors are disposed in the array substrate 10, and the thin film transistor serve as switch controllers to control activation and deactivation of each of the organic light emitting devices 51 in the organic light emitting device layer.

The pixel definition layer 20 is disposed on the array substrate 10 and is configured to limit a size of each of the organic light emitting devices 51 in the organic light emitting device layer. In particular, the pixel definition layer 20 comprises a first definition layer 21 layer and a second definition layer 22. The first definition layer 21 is disposed on a surface of the array substrate 10 (namely, a top surface of the array substrate 10). The second definition layer 22 is disposed on a surface of the first definition layer 21 away from the array substrate 10 (namely, a top surface of the first definition layer 21).

The pixel definition layer 20 comprises a plurality of position limiting apertures 30, and one of the organic light emitting devices 51 is disposed in each of the position limiting apertures 30. The position limiting apertures 30 comprises a first aperture 31 and a second aperture 32. The first aperture 31 penetrates the first definition layer 21 to a top surface of the array substrate 10. The second aperture 32 penetrates the second definition layer 22 and corresponds to the first aperture 31. The top end of the first aperture 31 communicates with the bottom end of the second aperture 32 such that a part of the surface of the array substrate 10 is exposed in the position limiting aperture 30. The organic light emitting device 51 is located in the first aperture 31 and is electrically connected to the thin film transistor in the array substrate 10 by an exposed surface of the array substrate 10 in the first aperture 31.

A top surface of the first definition layer 21 contacts a bottom surface of the second definition layer 22, and an area of the top surface of the first definition layer 21 is different from an area of the bottom surface of the second definition layer 22 such that a diameter of the top end of the first aperture 31 is different from a diameter of the bottom end of the second aperture 32 to make a part of the top surface of the first definition layer 21 or a part of the top surface of the second definition layer 22 exposed in the position limiting apertures 30 and also to make at least a part of a side surface of the first definition layer 21 and a side surface of the second definition layer 22 are in different planes. Namely, a sidewall of the first aperture 31 and a sidewall of the second aperture 32 are in two planes respectively to further interrupt a communication characteristic between the sidewall of the first aperture 31 and the sidewall of the second aperture 32 and destruct a flatness of a sidewall of the position limiting apertures 30.

At the same time, a film thickness of the organic light emitting layer 51 critical point is located at a connection portion between the first aperture 31 and the second aperture 32, and prevents uneven film formation of ink material of the organic light emitting devices 51 due to influence of Marangoni effect before curing by structures with unequal diameters at the connection portion between these two apertures to further improve the yield rate and the performance of the display panel 1.

In particular, in the embodiment of the present invention, as shown in FIG. 1, the area of the top surface of the first definition layer 21 is less than the area of the bottom surface of the second definition layer 22 such that the diameter of the top end of the first aperture 31 is greater than the diameter of the bottom end of the second aperture 32 to make a part of the bottom surface of the second definition layer 22 exposed in the first aperture 31 and shield a part of the top end of the first aperture 31. Also, it also makes the sidewall of the first aperture 31 dislocated with the sidewall of the second aperture 32 to block coherence between the sidewall of the first aperture 31 and the sidewall of the second aperture 32 and forms a step-shaped structure on a sidewall of the position limiting aperture 30 to damage a flatness of the sidewall of the position limiting aperture 30.

Furthermore, in the embodiment of the present invention, a thickness of the organic light emitting devices 51 is thinner than or equal to a thickness of the first definition layer 21. Preferably, the thickness of the organic light emitting devices 51 is equal to the thickness of the first definition layer 21, namely equal to a depth of the first aperture 31 such that an edge of a top surface of the organic light emitting devices 51 contacts the bottom surface of the second definition layer 22 exposed in the first aperture 31 to block surface fluidity of the ink material of the organic light emitting devices 51 before curing to make the surface of the ink material leveled automatically to further solve the issue of a concave or convex surface of the organic light emitting devices 51 due to influence of the Marangoni effect and increase surface flatness of the organic light emitting devices 51.

A first included angle $\alpha$ is defined between a plane in which the sidewall of the first aperture 31 is placed and the top surface of the array substrate 10. A second included angle $\beta$ is defined between a plane in which the sidewall of the second aperture 32 is placed and the top surface of the array substrate 10. Both the first included angle $\alpha$ and the second included angle $\beta$ are obtuse angles such that the first aperture 31 and the second aperture 32 become position limiting apertures 30 with an inverted trapezoidal cross-section to increase a light emitting region of the organic light emitting devices 51. Also, a central axis of the first aperture 31 coincides with a central axis of the second aperture 32, and both the central axis of the first aperture 31 and the central axis of the second aperture 32 are perpendicular to the top surface of the array substrate 10 to guarantee that light emitted from the organic light emitting devices 51 would not be shielded by the position limiting apertures 30, which improves a light emitting efficiency of the display panel.

Figure 2:
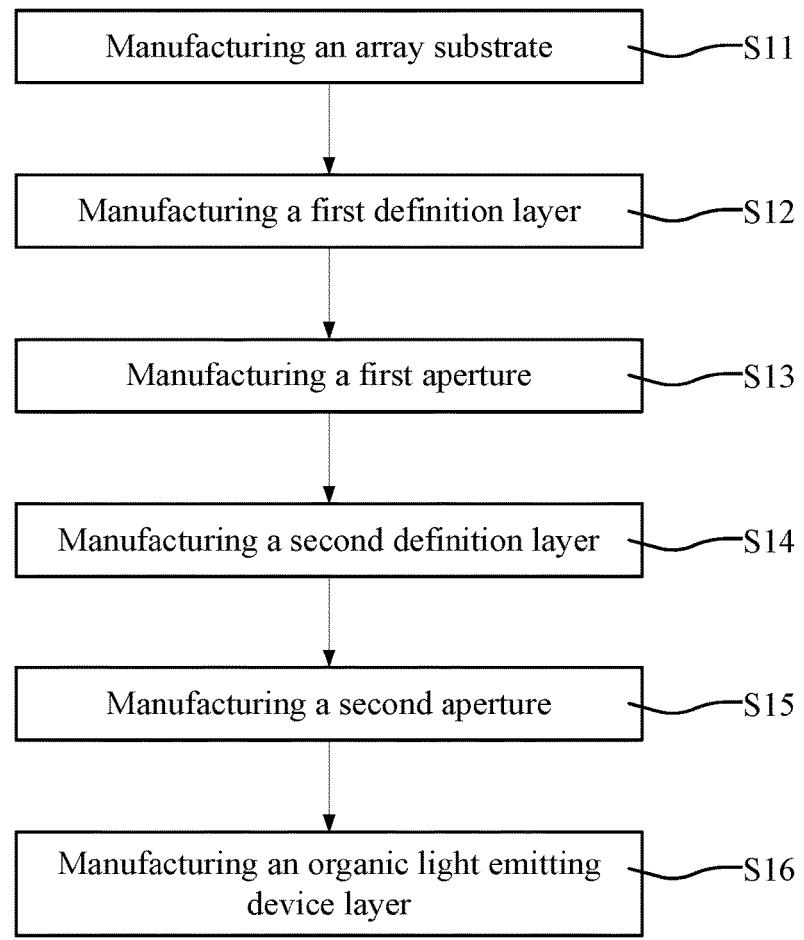
FIG. 2 is a flowchart of a display panel manufacturing method in the embodiment 1 of the present invention.

The embodiment of the present invention also provides a method for manufacturing a display panel 1 to manufacture the above display panel 1. A manufacturing process of the display panel 1 is as shown in FIG. 2 and comprises steps S11 to S16.

The step S11) comprises manufacturing an array substrate 10: forming an array substrate 10 by a thin film transistor (TFT) process.

The step S12) comprises forming a first definition layer 21 on the array substrate: covering a surface of the array substrate 10 with a layer of insulative material and forming a first definition layer 21.

Figure 3:
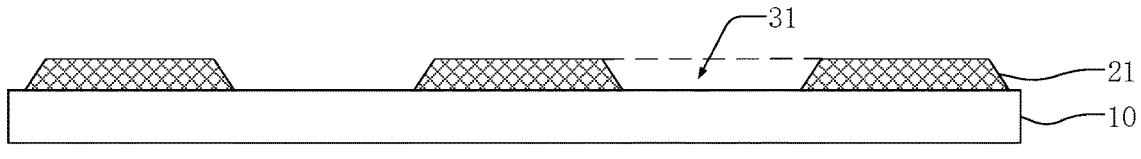
FIG. 3 is a schematic layer structural view of a step 12 of the embodiment 1 of the present invention patterning a first definition layer.

The step S13) comprises manufacturing a first aperture 31: patterning the first definition layer 21 a photolithography process and forming a first aperture 31 penetrating the first definition layer 21 as shown in FIG. 3.

The step S14) comprises manufacturing a second definition layer 22: covering a surface of the first definition layer 21 away from the array substrate 10 with a layer insulative material and forming a second definition layer 22.

Figure 4:
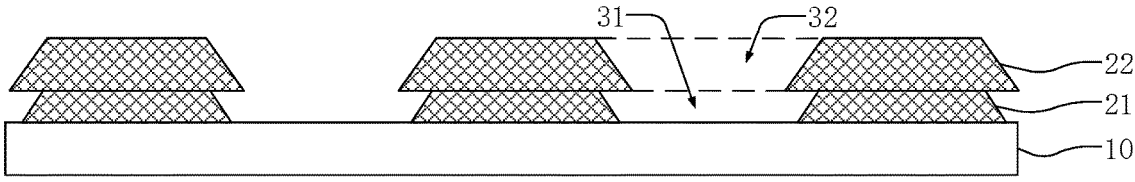
FIG. 4 is a schematic layer structural view of the step 12 of the embodiment 1 of the present invention patterning a second definition layer.

The step S15) comprises manufacturing a second aperture 32: patterning the second definition layer 22 by a photolithography process and forming a second aperture 32 penetrating the second definition layer 22 as shown in FIG. 4.

The step S16) comprises manufacturing an organic light emitting device layer: dripping ink material of an organic light emitting device 51 in each of position limiting apertures 30 by an inkjet printing process; drying and curing the ink material and forming the organic light emitting devices 51, wherein the organic light emitting devices 51 form the organic light emitting device layer as shown in FIG. 1.

An amount of exposure of lithographing the first definition layer 21 is greater than n amount of exposure of lithographing the second definition layer 22 such that a diameter of an aperture (namely a diameter of an aperture of the first aperture 31) etched in the first definition layer 21 is greater than a diameter of an aperture (namely a diameter of an aperture of the second aperture 32) etched in the second definition layer 22 such that the diameter of the top end of the first aperture 31 is greater than diameter of the bottom end of the second aperture. The second aperture 32 covers the first aperture 31. Accordingly, the first aperture 31 and the second aperture 32 correspond to each other vertically and communicate with each other such that the first aperture 31 and the second aperture 32 are combined to form the position limiting apertures 30.

In the present embodiment, lithographing the first definition layer 21 uses an over exposure process for exposure, and lithographing the second definition layer 22 uses a normal exposure progress for exposure to achieve a purpose of the amount of exposure of lithographing the first definition layer 21 being greater than the amount of exposure of lithographing the second definition layer 22.

In another embodiment, lithographing the first definition layer 21 can also uses the normal exposure progress for exposure, and lithographing the second definition layer 22 uses a weak exposure process for exposure to achieve a purpose of the amount of exposure of lithographing the first definition layer 21 being greater than the amount of exposure of lithographing the second definition layer 22.

In the embodiment of the present invention, a step-shaped structure is formed on the sidewall of the position limiting aperture to assist leveling of the ink material of the organic light emitting device to interrupt fluidity of the ink material before curing, prevent a Marangoni effect to further improve uniformity of film formation of the organic light emitting device, increase surface flatness of the organic light emitting device, and improve a yield rate and performance of the display panel.

Embodiment 2

The embodiment of the present invention provides a display panel 1, a layer-shaped structure of the display panel

Figure 5:
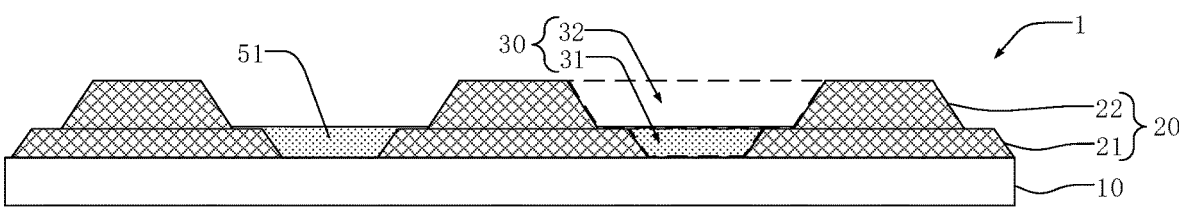
FIG. 5 is a schematic layer structural view of a display panel of the embodiment 2 of the present invention.

1 is similar to the display panel provided by the embodiment 1 of the present invention, and a difference thereof is that the area of the top surface of the first definition layer 21 and the area of the bottom surface of the second definition layer 22 are in different sizes. As shown in FIG. 5, in the embodiment of the present invention, the area of the top surface of the first definition layer 21 is greater than the area of the bottom surface of the second definition layer 22 such that the side surface of the second definition layer 22 intersects the top surface of the first definition layer 21 to make the diameter of the top end of the first aperture 31 less than the diameter of the bottom end of the second aperture 32 to make a part of the bottom surface of the first definition layer 21 exposed in the second aperture 32 and shield a part of the bottom end of the second aperture 32. Also, the sidewall of the first aperture 31 and the sidewall of the second aperture 32 are in two planes to interrupt coherence between the sidewall of the first aperture 31 and the sidewall of the second aperture 32, and a step-shaped structure is formed on the sidewall of the position limiting apertures 30 to damage flatness of the sidewall of the position limiting apertures 30.

The thickness of the organic light emitting devices 51 is greater than or equal to the thickness of the first definition layer 21. Preferably, the thickness of the organic light emitting devices 51 is greater than the thickness of the first definition layer 21. Namely the organic light emitting devices 51 extend from the first aperture 31 into the second aperture 32 and contact a top surface of the first aperture 31 to block surface fluidity of the ink material of the organic light emitting devices 51 before curing to make the surface of the ink material leveled automatically to further solve the issue of a concave or convex surface of the organic light emitting devices 51 due to influence of the Marangoni effect, increase surface flatness of the organic light emitting device, and improve the yield rate and the performance of the display panel 1. Also, to guarantee a leveling effect of the organic light emitting devices 51, the step-shaped structure on the sidewall of the position limiting apertures 30 is located at a critical point of the film thickness of the organic light emitting devices 51, a distance between a top surface of the organic light emitting devices 51 (namely the organic light emitting devices 51 away from a surface of the array substrate 10) and the array substrate 10 is less than a distance between a half portion of the second definition layer 22 and the array substrate 10.

Figure 6:
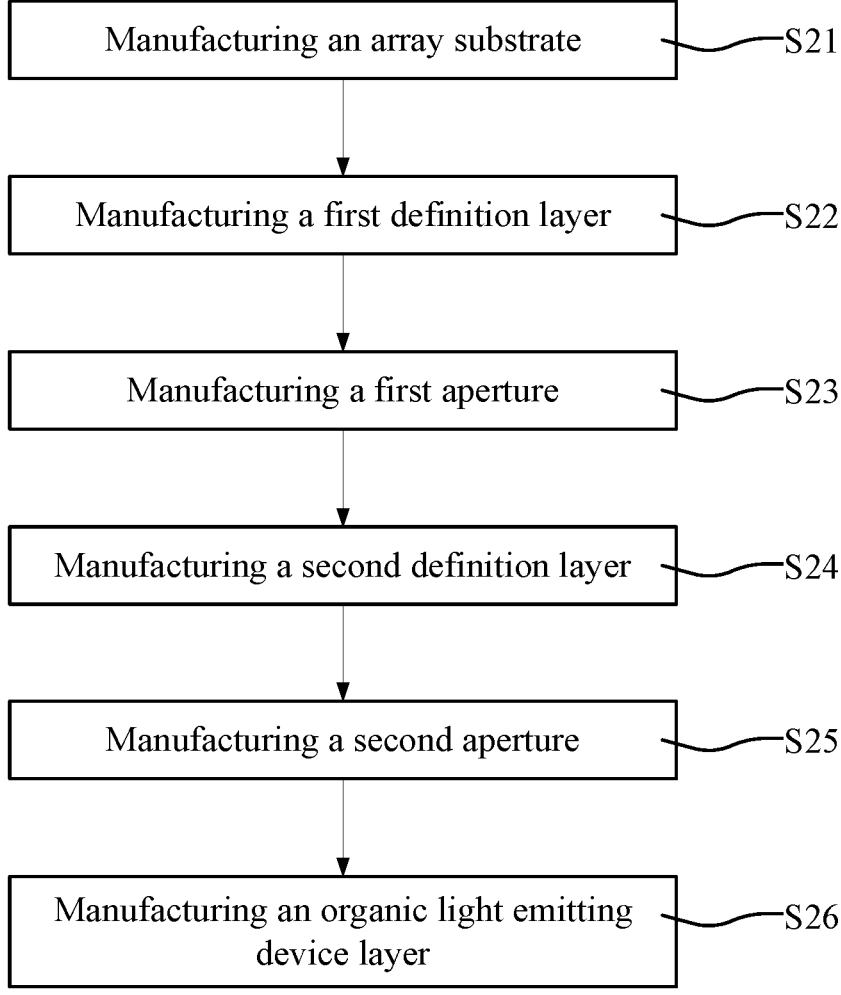
FIG. 6 is a flowchart of the display panel manufacturing method of the embodiment 2 of the present invention.

The embodiment of the present invention also provides a method for manufacturing a display panel 1 configured to manufacture the above display panel 1. The method for manufacturing the display panel 1 is as shown in FIG. 6 and comprises steps S21 to S23.

The step S21) comprises manufacturing an array substrate 10: forming the array substrate 10 by a thin film transistor (TFT) process.

The step S22) comprises manufacturing a first definition layer 21:

covering a surface of the array substrate 10 with a layer of insulative material and forming a first definition layer 21.

Figure 7:
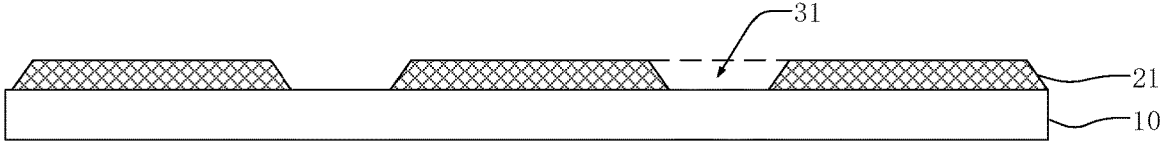
FIG. 7 is a schematic layer structural view of a step 22 of the embodiment 2 of the present invention patterning the first definition layer.

The step S23) comprises manufacturing a first aperture 31: patterning the first definition layer 21 by a photolithography process and forming a first aperture 31 penetrating the first definition layer 21 as shown in FIG. 7.

The step S24) comprises manufacturing a second definition layer 22: covering a surface of the first definition layer 21 away from the array substrate 10 with a layer of insulative material and forming a second definition layer 22.

Figure 8:
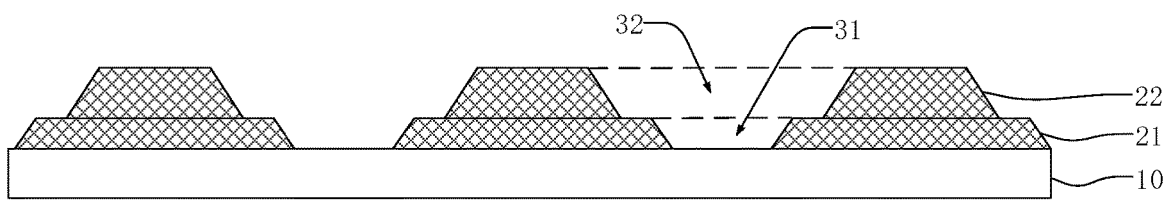
FIG. 8 is a schematic layer structural view of a step 22 of the embodiment 2 of the present invention patterning the second definition layer.

The step S25) comprises manufacturing a second aperture 32: patterning the second definition layer 22 by a photolithography process and forming a second aperture 32 penetrating the second definition layer 22 as shown in FIG. 8.

The step S26) comprises manufacturing an organic light emitting device layer: dripping ink material of an organic light emitting device 51 in each of position limiting apertures 30 by an inkjet printing process; drying and curing the ink material and forming the organic light emitting devices 51, wherein the organic light emitting devices 51 form the organic light emitting device layer. an amount of exposure of lithographing the first definition layer 21 is less than an amount of exposure of lithographing the second definition layer 22 such that a diameter of an aperture (namely a diameter of an aperture of the first aperture 31) etched in the first definition layer 21 is less than a diameter of an aperture (namely a diameter of an aperture of the second aperture 32) etched in the second definition layer 22 to make the diameter of the top end of the first aperture 31 less than the diameter of the bottom end of the second aperture 32. The second aperture 32 overlaps the first aperture 31. Accordingly, the first aperture 31 and the second aperture 32 correspond to each other vertically and communicate with each other such that the first aperture 31 and the second aperture 32 are combined to form the position limiting aperture 30.

In the present embodiment, lithographing the first definition layer 21 uses a normal exposure progress for exposure, lithographing the second definition layer 22 uses an over exposure process for exposure to achieve a purpose of the amount of exposure of lithographing the first definition layer 21 being less than the amount of exposure of lithographing the second definition layer 22.

In another embodiment, lithographing the first definition layer 21 can also use a weak exposure process for exposure, lithographing the second definition layer 22 can use normal exposure progress for exposure to achieve a purpose of the amount of exposure of lithographing the first definition layer 21 being less than the amount of exposure of lithographing the second definition layer 22.

In the embodiment of the present invention, a step-shaped structure is formed on the sidewall of the position limiting aperture to assist leveling of the ink material of the organic light emitting device to interrupt fluidity of the ink material before curing, prevent a Marangoni effect to further improve uniformity of film formation of the organic light emitting device, increase surface flatness of the organic light emitting device, and improve a yield rate and performance of the display panel.

Embodiment 3

The embodiment of the present invention provides a display panel 1, a layer-shaped structure of the display panel 1 is similar to the display panel provided by the embodiment 1 of the present invention, and a difference thereof is a structure of the first definition layer.

Figure 9:
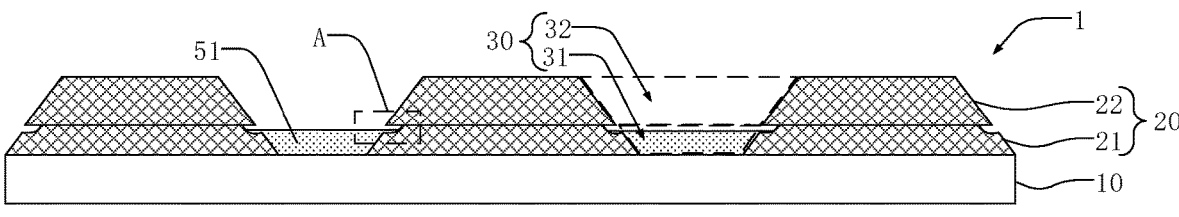
FIG. 9 is a schematic layer structural view of the display panel of the embodiment 3 of the present invention.
Figure 10:
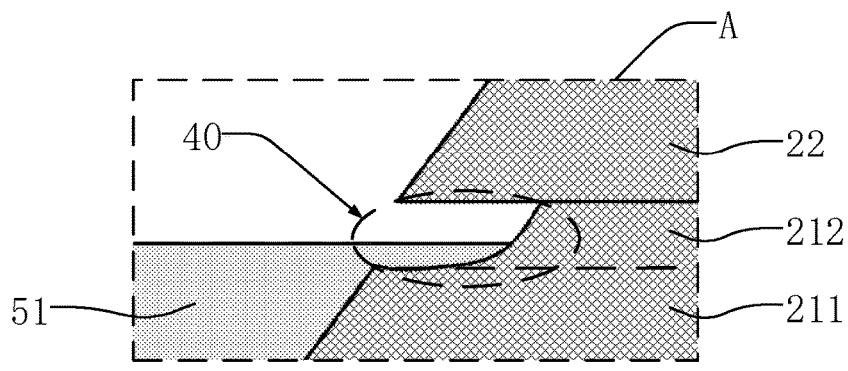
FIG. 10 is an enlarged schematic view of a bracket A of the display panel in FIG. 9.

In particular, as shown in FIGS. 9 and 10, the first definition layer 21 comprises a main body portion 211 and a reduction portion 212. The main body portion 211 is located on a side of the first definition layer 21 away from the second definition layer 22, and a side surface of the main body portion 211 and the side surface of the second definition layer 22 are in a same plane. The reduction portion 212 is located between the main body portion 211 and a top surface of the second definition layer 22. the reduction portion 212 (namely a surface of the reduction portion 212 away from the main body portion 211) contacts the second definition layer 22. Furthermore, an area of a top surface of the reduction portion 212 is less than the area of the bottom surface of the second definition layer 22, and an area of a bottom surface of the reduction portion 212 (namely a surface of the reduction portion 212 contacting the main body portion 211) is less than or equal to an area of a top surface of the main body portion 211 such that a chasm is formed between the side surface of the main body portion 211 and the side surface of the second definition layer 22 to interrupt coherence between the sidewall of the first aperture 31 and the sidewall of the second aperture 32 and form a notch 40 in the sidewall of the position limiting aperture 30 to damage flatness of the sidewall of the position limiting aperture 30, and also to make a part of the bottom surface of the second definition layer 22 exposed in the notch 40 and shielding a part of the top end of the first aperture 31. Furthermore, the notch 40 can be annular. Moreover, the first aperture 31, the second aperture 32, and the notch 40 can be tapered.

The central axis of the first aperture 31 coincides with the central axis of the second aperture 32, and both the central axis of the first aperture 31 and the central axis of the second aperture 32 are perpendicular to the top surface of the array substrate 10 to guarantee that light emitted from the organic light emitting devices 51 would not be shielded by the position limiting apertures 30, which improves a light emitting efficiency of the display panel.

The thickness of the organic light emitting devices 51 is less than or equal to the thickness of the first definition layer 21. Preferably, the thickness of the organic light emitting devices 51 is equal to the thickness of the first definition layer 21 and is greater than the thickness of the main body portion 211 such that notch 40 in the sidewall of the position limiting apertures 30 is located at a critical point of the film thickness of the organic light emitting devices 51 to make the organic light emitting devices 51 extend from the first aperture 31 into the notch 40 to block surface fluidity of the ink material of the organic light emitting devices 51 before curing to make the surface of the ink material leveled automatically to further solve the issue of a concave or convex surface of the organic light emitting devices 51 due to influence of the Marangoni effect, increase surface flatness of the organic light emitting devices 51, and improve the yield rate and the performance of the display panel 1.

Figure 11:
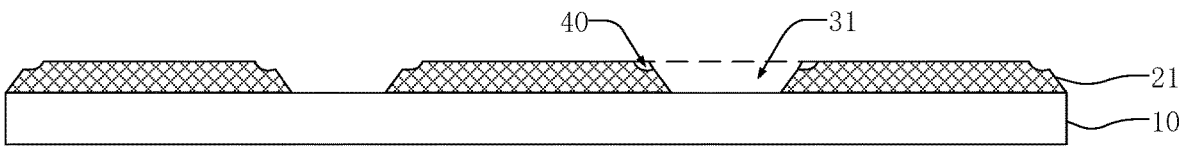
FIG. 11 is a schematic layer structural view of the embodiment 3 of the present invention patterning the first definition layer.
Figure 12:
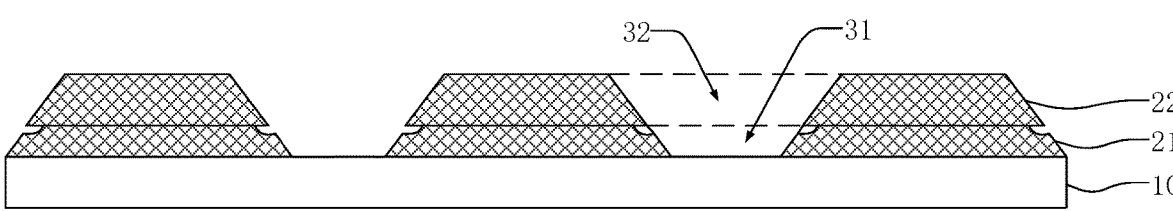
FIG. 12 is a schematic layer structural view of the embodiment 3 of the present invention patterning the second definition layer.

The method for manufacturing the display panel 1 in the embodiment of the present invention is similar to the method for manufacturing the display panel provided by the embodiment 1 of the present invention, and a difference thereof is that: in the embodiment of the present invention, when a first aperture 31 is etched in the first definition layer 21 as shown in FIG. 11, an over exposure process is used for exposure such that a diameter of an aperture of the top end of the first aperture 31 become larger to form a notch 40 surrounding the first aperture 31 at the top end of the first definition layer 21 to further increase the diameter at the top end of the first aperture 31. When a second aperture 32 is etched in the second definition layer 22 as shown in FIG. 12, the amount of exposure is reduced and a normal exposure progress is used for exposure such that the diameter of the second aperture 32 bottom end is less than the diameter at the top end of the first aperture 31 to form a notch 40 interrupting coherence of the position limiting apertures 30 at a middle of the pixel definition layer 20.

In the embodiment of the present invention, a notch is formed on the sidewall of the position limiting aperture to assist leveling of the ink material of the organic light emitting device to interrupt fluidity of the ink material before curing, prevent a Marangoni effect to further improve uniformity of film formation of the organic light emitting device, increase surface flatness of the organic light emitting device, and improve a yield rate and performance of the display panel.

Figure 13:
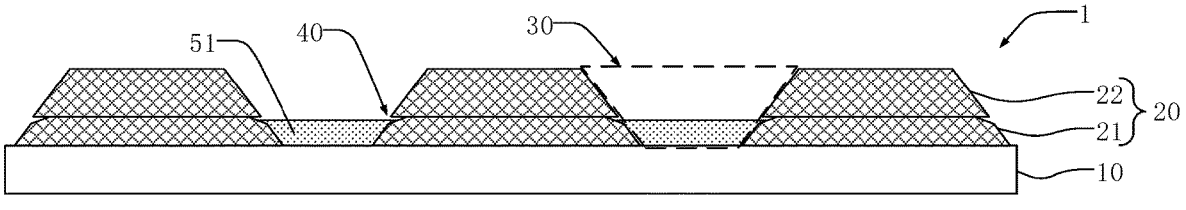
FIG. 13 is a schematic layer structural view of the display panel of another embodiment of the present invention.
Figure 14:
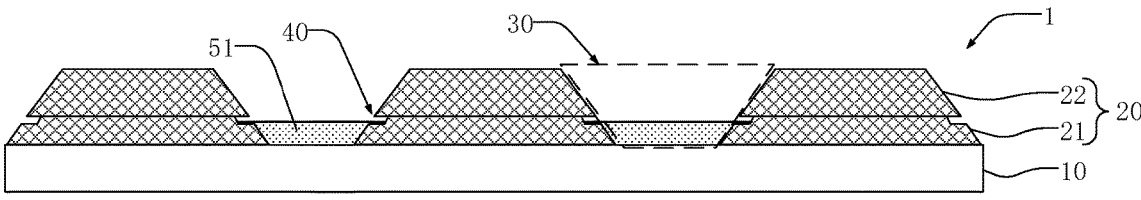
FIG. 14 is a schematic layer structural view of the display panel of another embodiment of the present invention.

In the display panel provided by another embodiment of the present invention, a shape of the notch is not limited. The shape of the notch can be curved as in the embodiment 3 of the present invention, and can be triangular as shown in FIG. 13 or quadrilateral as shown in FIG. 14. The layer-shaped structure of the display panel with the above notch structure and the manufacturing method thereof are similar to those of the display panel provided by the embodiment 3 of the present invention and are therefore not described repeatedly here. Based on embodiments in the present application, other embodiments obtained by a person of ordinary skill in the art without creative effort all belong to a protective range of the present application.

Embodiment 4

The embodiment of the present invention provides a display panel 1, a layer-shaped structure of the display panel 1 is similar to the display panel provided by the embodiment 1 of the present invention, and a difference thereof is that a location of a sidewall of the first aperture is different from a location of a sidewall of the second aperture.

Figure 15:
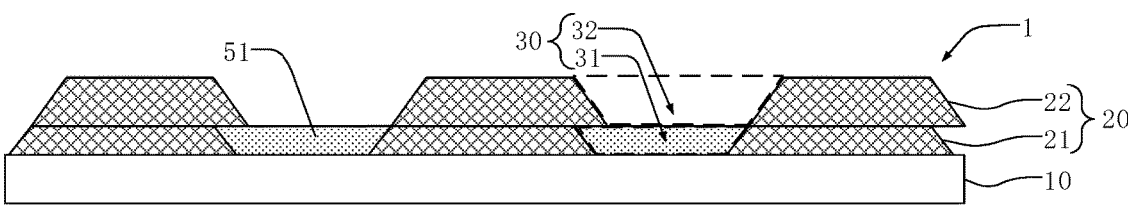
FIG. 15 is a schematic layer structural view of a display panel of the embodiment of the present invention 4.

In particular, as shown in FIG. 15, in the embodiment of the present invention, the area of the top surface of the first definition layer 21 is still less than the area of the bottom surface of the second definition layer 22. However, central axes of the first aperture 31 and the second aperture 32 of the embodiment of the present invention coincide with each other. Also, at least one side surface of the first definition layer 21 and at least one side surface of the second definition layer 22 are in a same plane such that the at least one side surface of the first definition layer 21 and the at least one side surface of the second definition layer are in different planes. Namely, the at least one sidewall of the first aperture 31 is flush with the at least one sidewall of the second aperture 32. Also, a sidewall on another side of the first aperture 31 and a corresponding sidewall in the second aperture 32 are dislocated to also achieve an effect of interrupting coherence between the sidewall of the first aperture 31 and the sidewall of the second aperture 32 to damage flatness of the sidewall of the position limiting aperture 30.

Although the present invention is described with reference to specific implementations in this specification, it should be understood that these embodiments are merely examples of the principles and applications of the present invention. Therefore, it should be understood that many exemplary embodiments can be modified, and other arrangements can be designed, as long as they do not deviate from the spirit and range of the present invention defined by the appended claims. It should be understood that different dependent claims and the features in the specification can be combined in ways different from those described in the original claims. It is also understood that the features described in combination with a separate embodiment can be used in other the embodiment.

What is claimed is:

1. A display panel, comprising:
an array substrate;
an organic light emitting device; and
a pixel definition layer, comprising:
a first definition layer disposed on a surface of the array substrate; and
a second definition layer disposed on a surface of the first definition layer away from the array substrate;

wherein a top surface of the first definition layer contacts a bottom surface of the second definition layer, and an area of the top surface of the first definition layer is different from an area of the bottom surface of the second definition layer such that at least a part of a side surface of the first definition layer and a side surface of the second definition layer are in different planes;

wherein the first definition layer comprises a first aperture, the side surface of the first definition layer is connected to a part of a top surface of the array substrate and surrounds the first aperture;

wherein the second definition layer comprises a second aperture corresponding to the first aperture, a top end of the first aperture is connected to a bottom end of the second aperture;

wherein the organic light emitting device is disposed in the first aperture;

wherein the area of the top surface of the first definition layer is less than the area of the bottom surface of the second definition layer; the side surface of the first definition layer intersects the bottom surface of the second definition layer; a diameter of the top end of the first aperture is greater than a diameter of the bottom end of the second aperture; and a part of the bottom surface of the second definition layer is exposed at the top end of the first aperture;

wherein a thickness of the organic light emitting device is thinner than or equal to a thickness of the first definition layer;

wherein the first definition layer comprises:
a main body portion located on a side of the first definition layer away from the second definition layer, wherein a side surface of the main body portion and a side surface of the second definition layer are in a same plane; and
a reduction portion located between the main body portion and the second definition layer;

wherein a top surface of the reduction portion contacts the bottom surface of the second definition layer, and an area of the top surface of the reduction portion is less than the area of the bottom surface of the second definition layer;

wherein a thickness of the main body portion is thinner than the thickness of the organic light emitting device.

2. The display panel according to claim 1, wherein a thickness of the reduction portion is thinner than a thickness of the main body portion.

3. The display panel according to claim 1, wherein a central axis of the first aperture coincides with a central axis of the second aperture.

4. The display panel according to claim 1, wherein a chasm is formed between the side surface of the main body portion and the side surface of the second definition layer.

5. The display panel according to claim 4, wherein
the pixel definition layer comprises a position limiting aperture comprising the first aperture and the second aperture; and
the chasm forms a notch in a sidewall of the position limiting aperture.

6. The display panel according to claim 4, wherein the notch makes the sidewall of the position limiting aperture non-flat and makes a part of the bottom surface of the second definition layer exposed in the notch to shield a part of the top end of the first aperture.

7. The display panel according to claim 5, wherein the notch is annular.

8. The display panel according to claim 5, wherein the first aperture, the second aperture, and the notch are tapered.

9. A display panel, comprising:

an array substrate;

an organic light emitting device; and a pixel definition layer, comprising:

a first definition layer disposed on a surface of the array substrate; and a second definition layer disposed on a surface of the first definition layer away from the array substrate;

wherein a top surface of the first definition layer contacts a bottom surface of the second definition layer, and an area of the top surface of the first definition layer is different from an area of the bottom surface of the second definition layer such that at least a part of a side surface of the first definition layer and a side surface of the second definition layer are in different planes;

wherein the first definition layer comprises a first aperture, the side surface of the first definition layer is connected to a part of a top surface of the array substrate and surrounds the first aperture;

wherein the second definition layer comprises a second aperture corresponding to the first aperture, a top end of the first aperture is connected to a bottom end of the second aperture;

wherein the organic light emitting device is disposed in the first aperture;

wherein the area of the top surface of the first definition layer is less than the area of the bottom surface of the second definition layer; the side surface of the first definition layer intersects the bottom surface of the second definition layer; and a diameter of the top end of the first aperture is greater than a diameter of the bottom end of the second aperture;

wherein the first definition layer comprises:

a main body portion located on a side of the first definition layer away from the second definition layer, wherein a side surface of the main body portion and a side surface of the second definition layer are in a same plane; and a reduction portion located between the main body portion and the second definition layer;

wherein a top surface of the reduction portion contacts the bottom surface of the second definition layer, and an area of the top surface of the reduction portion is less than the area of the bottom surface of the second definition layer;

wherein a thickness of the main body portion is thinner than the thickness of the organic light emitting device.

10. The display panel according to claim 9, wherein a thickness of the reduction portion is thinner than a thickness of the main body portion.

11. The display panel according to claim 9, wherein a central axis of the first aperture coincides with a central axis of the second aperture.

12. The display panel according to claim 9, wherein a chasm is formed between the side surface of the main body portion and the side surface of the second definition layer.

13. The display panel according to claim 12, wherein the pixel definition layer comprises a position limiting aperture comprising the first aperture and the second aperture; and the chasm forms a notch in a sidewall of the position limiting aperture.

14. The display panel according to claim 12, wherein the notch makes the sidewall of the position limiting aperture non-flat and makes a part of the bottom surface of the second definition layer exposed in the notch to shield a part of the top end of the first aperture.

15. The display panel according to claim 13, wherein the notch is annular.

16. The display panel according to claim 13, wherein the first aperture, the second aperture, and the notch are tapered.

* * * * *